US007833435B2

(12) United States Patent
Hey et al.

(10) Patent No.: US 7,833,435 B2
(45) Date of Patent: Nov. 16, 2010

(54) POLISHING AGENT

(75) Inventors: Gabriele Hey, Odenthal (DE); Alessandro Aghina, Milan (IT)

(73) Assignee: Akzo Nobel Chemicals International B.V. (NL)

( * ) Notice: Subject to any disclaimer, the term of this patent is extended or adjusted under 35 U.S.C. 154(b) by 757 days.

(21) Appl. No.: 11/710,035

(22) Filed: Feb. 23, 2007

(65) Prior Publication Data

US 2007/0207617 A1  Sep. 6, 2007

(30) Foreign Application Priority Data

Feb. 24, 2006  (DE) .................. 10 2006 008 689

(51) Int. Cl.
*C09K 13/00* (2006.01)
(52) U.S. Cl. .................. 252/79.1; 216/89; 438/693
(58) Field of Classification Search ................ 252/79.1; 216/89; 438/692, 693
See application file for complete search history.

(56) References Cited

U.S. PATENT DOCUMENTS

| 4,915,710 A | * | 4/1990 | Miyazaki et al. ............ 51/309 |
| 5,366,542 A | | 11/1994 | Yamada et al. |
| 5,859,273 A | | 1/1999 | Wilson et al. |
| 6,083,840 A | * | 7/2000 | Mravic et al. ............... 438/693 |
| 6,107,518 A | | 8/2000 | Groth et al. |
| 6,338,743 B1 | | 1/2002 | Dusemund et al. |
| 6,538,142 B1 | | 3/2003 | Breviglieri et al. |
| 2002/0124474 A1 | | 9/2002 | Wojtczak et al. |
| 2002/0170237 A1 | | 11/2002 | Vogt et al. |

FOREIGN PATENT DOCUMENTS

| DE | 19713911 A1 | | 10/1998 |
| DE | 19817087 A1 | | 11/1998 |
| DE | 10063488 A1 | | 6/2002 |
| DE | 10304894 B4 | | 9/2003 |
| EP | 1229094 A2 | | 8/2002 |
| JP | 2001077063 | | 3/2001 |
| JP | 2001176826 | | 6/2001 |
| JP | 2006150482 A | * | 6/2006 |
| WO | WO-0106553 A1 | | 1/2001 |

* cited by examiner

*Primary Examiner*—Roberts Culbert
(74) *Attorney, Agent, or Firm*—Connolly Bove Lodge & Hutz LLP

(57) ABSTRACT

The invention relates to the use of gluconates in the production of semiconductor wafers, preferably in the polishing of the semiconductor wafers during the production process, and to a polishing agent based on an abrasive substance and/or colloid and a mixture of disuccinates or methylglycine diacetic acid (MGDA) and gluconates.

16 Claims, No Drawings

POLISHING AGENT

The invention relates to the use of gluconates in the production of semiconductor wafers, preferably in the polishing of the semiconductor wafers during the production process, and to a polishing agent based on an abrasive substance and/or colloid and a mixture of disuccinates or methylglycine diacetic acid (MGDA) and gluconates.

Processes for the polishing of semiconductor wafers are known. In these processes, the semiconductor wafers are moved across a polishing plate covered with a polishing cloth, with the introduction of a polishing agent. The polishing agent contains abrasive substances or colloids and is—depending on the area of application—acidic, neutral or alkaline. The semiconductor wafer, e.g. a silicon semiconductor wafer, is uncovered or covered with native oxide from 1 to 1.5 nm thick or, in the case of the manufacture of electronic components, at least partly covered with artificially applied layers and/or structures. Alkaline suspensions based on silica, e.g. according to DE 198 17 087 A1 and DE 100 63 488 A1, to which a wide range of other abrasive substances can be added, are widely used as chemical mechanical polish in carrying out these processes.

In most cases the level of metal contamination plays an important part since, if critical limits are exceeded, a large number of negative effects are created in the component production process, which is necessarily associated with losses of yield. Copper occupies a special position, penetrating even at room temperature into a silicon surface not protected by the native oxide, e.g. during polishing. When semiconductor wafers are polished in the context of component manufacture, copper is sometimes used intentionally today, e.g. to produce electrical tracks.

Polishing agents have therefore been developed which bind undesirable traces of copper during the polishing of uncovered semiconductor wafers, or copper released by polishing from component layers or structures, and thus remove it from the equilibrium. According to WO 01/06553 A1, this is achieved by the formation of sparingly soluble copper compounds. Another strategy is the use of chelating agents, which are claimed e.g. in U.S. Pat. No. 5,366,542, US 2002/0124474 A1, JP 2001 077 063 A, JP 2001 176 826 A and EP 1 229 094 A1. These chelating agents are multifunctional organic molecules, which form cage compounds (chelates) with at least two coordination points having a free electron pair with metal ions, e.g. positively charged copper ($Cu^{2+}$), and thus also contribute to copper binding. Effective chelating agents are acetic acid derivatives, such as iminodiacetate (IDA), ethylenediamine tetraacetate (EDTA) and diethylenetriamine pentaacetate (DTPA), which are generally used in the form of their sodium salts, which are readily accessible industrially, e.g. $Na_2IDA$, $Na_4EDTA$ and $Na_5DTPA$.

A disadvantage of polishing agents with chelating agents having acetate groups is that they are degradable only with difficulty in biological sewage treatment and either lead to ecological damage or have to be eliminated in cost-intensive additional sewage treatment processes such as oxidation with ozone or incineration. In DE 10 304 894 B4, therefore, a polishing agent based on disuccinates was developed. In application, however, it was shown that the complexing capacity of the disuccinates is limited and, particularly in the presence of iron ions, undesirable iron hydroxide precipitations can occur.

The object of the invention is to provide a polishing agent that is suitable for the polishing of semiconductor wafers, contains a chelating agent with a high complexing capacity for copper ions and at the same time does not lead to problems in biological sewage treatment, as well as preventing undesirable precipitations, especially those of iron hydroxides.

In the context of work relating to the present invention, it has been found that gluconates, preferably alkali salts or alkaline earth salts of gluconic acid, particularly preferably the alkali salts of gluconic acid, can be used in the production of semiconductor wafers, particularly preferably in the polishing of the semiconductor wafers during the production process.

The invention also provides a polishing agent, however, which contains as components a) water, b) abrasive substance and/or colloid, c) methylglycine diacetic acid (MGDA) or a disuccinate of the formula

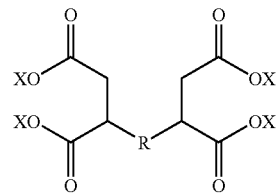

wherein
R denotes —$(NH\text{—}CH_2\text{—}CH_2\text{—})_n NH$—,
X denotes hydrogen and/or an alkali metal and
n denotes an integer from 0 to 2 and d) an alkali salt or alkaline earth salt of gluconic acid.

The invention additionally provides a process for the polishing of a semiconductor wafer with a front surface and a back surface and an edge, which is characterised in that a polishing agent of the above type is employed.

Surprisingly, the polishing agents according to the invention containing the combination of MGDA or disuccinates and gluconates display on the one hand the advantages known from DE 10 304 894 B1, but in addition excellent complexing properties with regard to additional undesirable cations, such as iron, copper and nickel.

The components of the polishing agent according to the invention and its use in the polishing of semiconductor wafers are described in more detail below. As component (a), for various reasons of principle and of a technological and ecological nature, as well as for reasons of cost, water is used as the fluid or carrier medium for the ingredients of the polishing agent. Water purified by distillation, deionisation, reverse osmosis, filtration and/or comparable processes is preferred. Ultrapure water with a conductivity of 18 $(M\Omega \cdot cm)^{-1}$ is particularly preferred. Water is preferably present in the polishing agent according to the invention in a proportion of 45 to 99.9 wt. % and particularly preferably in a proportion of 84 to 99.8 wt. %. If necessary, however, mixtures of water with organic or inorganic solvents can also be used.

A large number of aqueous suspensions of abrasive substances or aqueous sols or colloids with a defined particle size distribution, which can be in the nanometre to micrometre range depending on the intended application, are suitable as the abrasive substance and/or colloid (component (b)). Examples of solids that can be used here are $SiO_2$, $TiO_2$, $ZrO_2$, $CeO_2$, $SnO_2$, $Al_2O_3$, $Si_3N_4$ and/or SiC. In the context of the polishing of semiconductor wafers made especially of silicon, silica is preferred as component (b) in a proportion of 0.05 to 50 wt. %, based on $SiO_2$; a proportion of 0.1 to 10 wt.

%, based on SiO$_2$, is particularly preferred. The production of appropriate silicas can take place according to the prior art by precipitation and purification e.g. of water glass (sodium silicate), by hydrolysis of silicates or by incineration of SiCl$_4$. In the case of silica being used as component (b), an alkaline stabilisation is preferred.

As component (c), MGDA or disuccinates are used. Disuccinates are compounds with two succinic acid units, with the formula

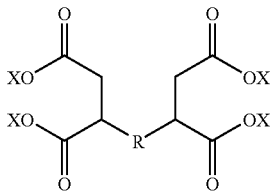

which already possess with their carboxylic acid groups four potential coordination sites for the formation of complexes with multivalent metals. If the connecting group R additionally contains at least one nitrogen atom with a free electron pair, a chelating agent is present which, in contrast to the chelating agents in polishing agents according to the prior art with their strongly electron-attracting acetate groups on the nitrogen atom, is biodegradable and yet possesses good complexing properties for multivalent transition metal ions.

In addition to MGDA, disuccinates with R=—(NH—CH$_2$—CH$_2$—)$_n$NH—, wherein n represents an integer from 0 to 2 and X denotes hydrogen or an alkali metal, have proved suitable according to the invention:

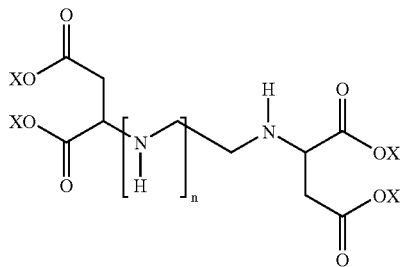

Preferred compounds of this group (c) are, in addition to MGDA, the three representatives: iminodisuccinic acid, (abbreviated as IDS; n=0), and its salts, e.g. tetrasodium iminodisuccinate (Na$_4$IDS) with the formula

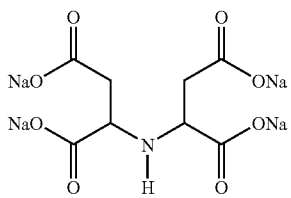

These compounds and their use in paper production are described e.g. in DE 197 13 911 A1.

Other preferred compounds of group (c) are ethylenediamine disuccinic acid (abbreviated as EDDS; n=1) and its salts, e.g. tetrasodium ethylenediamine disuccinate (Na$_4$EDDS) with the formula

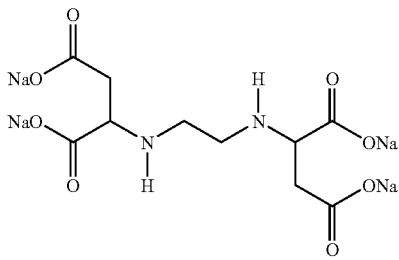

These compounds and their use in photography, gas treatment and copper deposition are known e.g. from U.S. Pat. No. 5,859,273. Also suitable as component (c) for implementing the invention is diethylenetriamine disuccinic acid (abbreviated as DTDS; n=2) and its salts, e.g. tetrasodium diethylenetriamine disuccinate (Na$_4$DTDS).

Polishing agents containing as component (c) iminodisuccinic acid (n=0) and/or ethylenediamine disuccinic acid (n=1) and/or diethylenetriamine disuccinic acid and/or one or more salts of these compounds or methylglycine diacetic acid are therefore preferred according to the invention.

MGDA and the above-mentioned compounds IDS, EDDS and DTDS are added, the latter preferably as an acid or alkali salt, in a proportion of 0.005 to 5 wt. %. Particularly preferred is the addition of the MGDA or of a sodium and/or potassium salt of IDS, EDDS or DTDS in a proportion of 0.01 to 1 wt. %. When the above proportions are present, heavy metal ions present in the polishing agent according to the invention, such as $Cu^{2+}$, $Ni^{2+}$ and $Fe^{3+}$, are effectively bound. The resulting chelates remain in solution; however, the undesirable metal ions, e.g. $Cu^{2+}$ in the polishing of semiconductor wafers, are chemically blocked and rendered harmless thereby. The significant difference from the chelating agents with acetate groups contained in polishing agents according to the prior art lies in the fact that MGDA and the above-mentioned disuccinic acids and their salts, and chelates with metal ions formed therewith, are degraded in the conventional biological sewage treatment plants without any problems, which is not the case e.g. with IDA, EDTA and DTPA. The risk existing in the case of the last-mentioned chelating agents, of such substances passing into the environment undecomposed and, for example, leaching toxic heavy metals out of sewage sludges or sediments, does not exist with MGDA, IDS, EDDS and DTDS.

As component (d), alkali salts or alkaline earth salts of gluconic acid are used. All forms of the salts of gluconic acid can be used as polishing agents. The least expensive is D (+) gluconic acid [CAS 526-95-4] or its alkali or alkaline earth salts. The alkali salts of gluconic acid, particularly the sodium or potassium salts of gluconic acid, are preferred according to the invention.

Component (d) is contained in the polishing agent according to the invention at a level of 0.005 to 5 wt. %, preferably 0.01 to 0.5 wt. %.

The preferred pH of polishing agents containing the components (a) to (c) or the components (a) to (d) is pH 8 to pH 13, particularly preferably pH 9 to pH 12.

A polishing agent comprising components (a), (b), (c) and (d) can already, in various cases, be capable of fulfilling its intended purpose. This applies e.g. to those cases in which a polishing is carried out with a high mechanical component, e.g. with Al$_2$O$_3$ as the abrasive substance. This also applies where an alkaline system is required and the abrasive substance or colloid used, e.g. silica, has already undergone adequate alkaline stabilisation and the pH of 8 to 13 preferred in this case has been reached. It is advantageous in this case that, for example, commercial silica colloids, particularly after the removal e.g. of alkali metal ions by ion exchange, already possess an alkalinity and buffer effect that are adequate in some cases. However, there can also be cases, particularly when carrying out chemical mechanical polishing (CMP), in which the additional introduction of alkaline compounds is advantageous to adjust the pH to the desired value and/or to form a buffer system with an increased buffer capacity and thus a low variation in pH value during polishing. In their fundamental nature, however, there is no difference between the polishing agents according to the invention with and without the addition of other components.

The polishing agent can optionally contain only components (a), (b) and (d).

Suitable as optional additional components (c) are basic salts or hydroxides of alkali metal ions or ammonium ions in a proportion of preferably 0.01 to 10 wt. % and particularly preferably 0.05 to 5 wt. %. Alkali metals are lithium, sodium, rubidium and caesium; sodium ($Na^+$) and potassium ($K^+$) ions are preferred. Ammonium ions are e.g. ammonium ($NH_4^+$) and tetramethylammonium ($N(CH_3)_4^+$, abbreviated as (TMAH). Alkali salts are e.g. carbonates ($CO_3^{2-}$) and hydrogen carbonates ($HCO_3^-$) of the above-mentioned cations. Alkaline Na and/or K salts are preferred in implementing the invention; $Na_2CO_3$ and $K_2CO_3$ are particularly preferred.

The polishing agent according to the invention can additionally contain other components, which support the particular application from the wide range of possible uses. These other components should not exceed a proportion of preferably 5 wt. % and particularly preferably 1 wt. % to avoid changing the nature of the polishing agent according to the invention. Such additional components can be, for example, oxidising agents, such as hydrogen peroxide, polishing accelerators and anti-corrosives, such as amines and carboxylic acids, such as butanol and polyvinyl alcohol, and other organic compounds, such as cellulose compounds and amino acids, and inorganic compounds, such as salts, oxides and hydroxides.

Different variations are possible for the preparation of the polishing agent according to the invention. Thus, all the components can be mixed in a vessel, e.g. by stirring or pump circulation, and conveyed to the polishing equipment by pumping or gravitation. A pre-dilution of concentrated solutions of the components may be sensible. However, it is also possible and may be advantageous in practice, particularly when adding the alkaline component (c), to produce two premixes, e.g. water with abrasive substance, colloid and $Na_4IDS$, MGDA or $Na_4DTDS$ and gluconate (premix 1) and water with alkaline component (e) (premix 2), and to combine these only at the polishing location. In all the methods of operation that can be implemented, it should be ensured that the pH range suitable for suspensions of the component (b) used is not left in too acidic or too alkaline a direction, even for a short time, to avoid precipitation or gel formation, which would have a negative effect on the properties of the polishing agent.

The polishing agent according to the invention is also suitable for recycling. During this operation, part of the used polishing agent is generally replaced with fresh polishing agent or topped up by targeted introduction of the used components in each case. After a certain number of polishing operations or after a particular service life it is advisable to replace the batch of polishing agent completely with a fresh batch. In this way, gradual alteration of the polishing agent properties is counteracted and too great an accumulation of heavy metal ions, particularly copper and nickel, is counteracted, although these are present in the form of disuccinic acid chelates or chelates with MGDA.

The polishing agent according to the invention is suitable for a wide range of applications, semiconductor wafers being the preferred object of the polishing with regard to contamination with metallic impurities, particularly copper and nickel. During polishing, the chelating agent present as component (b) (MGDA or IDS, EDDS and/or DTDS; as free acid or salt) protects the semiconductor wafers from introduction of these metals by the formation of chelates which, while it is true that they remain in solution, do however chemically deactivate ions such as $Cu^{2+}$ and $Ni^{2+}$ and inhibit their incorporation into the lattice of the semiconductor wafer. In principle, two types of polishing process can be distinguished: (1) polishing of semiconductor wafers that are uncoated or coated only with the native oxide, made e.g. of silicon, in which for example $Cu^{2+}$ and $Ni^{2+}$ are present as unavoidable contaminants and have to be blocked, and (2) polishing of semiconductor wafers during component manufacture, which are covered with artificially applied layers and/or structures, which may contain intentionally added copper which is blocked by the chelating agent immediately on release and does not penetrate into other parts of the component or the semiconductor wafer itself and cause damage, e.g. by electrical leakage currents or even short circuits.

In the context of the polishing (1) of semiconductor wafers that are uncoated or coated only with the native oxide, made e.g. of silicon, with an edge and a front surface and a back surface, various applications of the polishing agent according to the invention can be differentiated. Thus, the edge of the semiconductor wafer can be polished to prevent adhesion of particles during component manufacture. If a notch is present as an orientation feature for the crystal axes, this can also be polished. For these applications, edge polishing machines of suitable size are available on the market.

Implementing the polishing process according to the invention to polish at least one front surface of the semiconductor wafer is achieved either as a one- or two-side polish, again on equipment according to the prior art. In the case of one-side polishing, one or more usually etched semiconductor wafers are attached to a carrier unit with their reverse side held by wax, vacuum or adhesion and are moved with the front surface generally rotating over a polishing plate, usually also rotating, to which a polishing cloth is stuck, with continuous introduction of a polishing agent meeting the conditions of the invention. In the case of two-side polishing, one or more silicon wafers are moved between two generally contra-rotating polishing plates to which a polishing cloth is stuck, also with continuous introduction of said polishing agent, usefully being moved by one or more rotating discs on a predetermined path relative to the polishing plates, which results in simultaneous polishing of the front and back surfaces of the silicon wafers.

A particularly preferred polishing agent within the framework of the invention for the polishing of semiconductor wafers made of silicon that are uncoated or coated only with native oxide possesses a pH value of 9 to 12 and contains water in a proportion of 84 to 99.8 wt. %, precipitated silica in a proportion of 0.1 to 10 wt. %, calculated as $SiO_2$, sodium or potassium salt of iminodisuccinic acid and/or ethylenediamine disuccinic acid or MGDA in a proportion of 0.01 to 1 wt. %, sodium and/or potassium carbonate in a proportion of 0.05 to 5 wt. % and sodium or potassium gluconate in a proportion of 0.001 to 0.5 wt. %.

The polishing (2), during component manufacture, of semiconductor wafers that are covered with artificially applied layers and/or structures, now plays an important part in the manufacture of latest-generation components. This generally involves the use of one-side polishing methods and equipment, which are comparable with those described in (1). In this case, the process is known as chemical-mechanical planarisation (also abbreviated as CMP). The polishing agent according to the invention is outstandingly suitable particularly for the polishing of layers of tungsten and copper. Compared with the polishing of uncovered surfaces, abrasive substances and/or colloids with a coarser particle size and harder polishing cloths are preferred in this case.

The analytical determination of the copper content in the silicon lattice can take place by methods that have a relatively high recovery rate, e.g. a recovery rate of more than 90%. For this purpose, the silicon wafer to be analysed can be completely dissolved in a high-purity mixture of concentrated nitric acid and concentrated hydrofluoric acid and the copper proportion determined by spectroscopy after evaporation and taking up in dilute acid. This method is complex and associated with a relatively high measuring error. A method is preferred in which gettering layers, which attract copper to the surface almost quantitatively, consisting e.g. of polysilicon, are vapour-deposited on to the surface of the silicon wafer at elevated temperatures and then chemically detached and analysed.

The addition of MGDA or IDS, EDDS, DTDS or their salts as component (c) in combination with gluconates as component (d) in the polishing agent according to the invention provides an excellent combination of effective chelation and thus blocking of e.g. copper ions with the ecological aspect of biodegradability, with the advantage of markedly reduced disposal costs for the used polishing agent and a precipitation of hydroxides, particularly iron hydroxides, occurring particularly in the alkaline range.

EXAMPLES c) methylglycine diacetic acid or a disuccinate of the formula

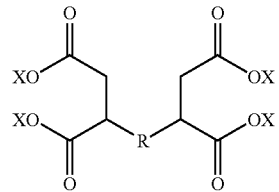

wherein
R denotes —(NH—$CH_2$—$CH_2$—)$_n$NH—,
X denotes hydrogen and/or an alkali metal,
n is an integer from 0 to 2 and
d) an alkali salt or alkaline earth salt of gluconic acid.

2. The polishing agent according to claim 1, wherein the component b) comprises silica in a proportion of 0.05 to 50 wt. %, calculated as $SiO_2$.

3. The polishing agent according to claim 1, wherein the pH value is from 8 to 13.

4. The polishing agent according to claim 1, wherein the sodium or potassium salts are used as alkali salts of gluconic acid.

5. The polishing agent according to claim 1, wherein component (c) comprises iminodisuccinic acid (n=0) and/or ethylenediamine disuccinic acid (n=1) and/or diethylenetriamine disuccinic acid and/or one or more salts of these compounds or methylglycine diacetic acid.

6. The polishing agent according to claim 1, wherein contains component (c) in a proportion of 0.005 to 5 wt. %.

7. The polishing agent according to claim 1, wherein one or more basic salts and/or hydroxides of alkali metal ions and/or ammonium ions are contained in a proportion of 0.01 to 10 wt. % as additional component (e).

8. The polishing agent according to claim 1, wherein the agent has a pH value of 9 to 12, and comprises components

| Aqueous polishing agent (pH 11.0) for polishing silicon wafers (proportions in wt. %) | | | | Polishing process | Biodegradable | Copper in Si wafer (mass in ppb) | Fe in form of hydroxide precipitations after several polishes |
|---|---|---|---|---|---|---|---|
| (b) | (c) | (d) | (e) | | | | |
| — | — | — | — | — | (beforehand) | — | <0.1 | — |
| V1 | $SiO_2$ (3.0) | — | — | $K_2CO_3$ (2.0) | DSP | Yes | 3.5 | Yes |
| V2 | $SiO_2$ (3.0) | $Na_4IDS$ (0.15) | — | $K_2CO_3$ (2.0) | DSP | Yes | 0.3 | Yes |
| V3 | $SiO_2$ (3.0) | $Na_4EDDS$ (0.15) | — | $K_2CO_3$ (2.0) | DSP | Yes | 0.4 | Yes |
| V4 | $SiO_2$ (3.0) | $Na_3MGDA$ (0.15) | — | $K_2CO_3$ (2.0) | DSP | Yes | 0.4 | Yes |
| V5 | $SiO_2$ (3.0) | $Na_4EDTA$ (0.15) | — | $K_2CO_3$ (2.0) | DSP | No | 0.3 | No |
| V6 | $SiO_2$ (3.0) | $Na_5DTPA$ (0.15) | — | $K_2CO_3$ (2.0) | DSP | No | 0.4 | No |
| V7 | $SiO_2$ (3.0) | $Na_4IDS$ (0.15) | Na gluconate (0.05) | $K_2CO_3$ (2.0) | DSP | Yes | 0.3 | No |
| V8 | $SiO_2$ (3.0) | $Na_4EDDS$ (0.15) | Na gluconate (0.05) | $K_2CO_3$ (2.0) | DSP | Yes | 0.4 | No |
| V9 | $SiO_2$ (3.0) | $Na_3MGDA$ (0.15) | Na gluconate (0.05) | $K_2CO_3$ (2.0) | DSP | Yes | 0.4 | No |
| V10 | $SiO_2$ (3.0) | $Na_4IDS$ (0.15) | — | $K_2CO_3$ (2.0) | SSP | Yes | 0.2 | Yes |
| V11 | $SiO_2$ (3.0) | $Na_4EDTA$ (0.15) | — | $K_2CO_3$ (2.0) | SSP | No | 0.2 | No |
| V12 | $SiO_2$ (3.0) | $Na_5DTPA$ (0.15) | — | $K_2CO_3$ (2.0) | SSP | No | 0.3 | No |
| V13 | $SiO_2$ (3.0) | $Na_4IDS$ (0.15) | Na gluconate (0.05) | $K_2CO_3$ (2.0) | SSP | Yes | 0.2 | No |
| V14 | $SiO_2$ (3.0) | — | — | $K_2CO_3$ (2.0) | SSP | Yes | 1.5 | No |

The invention claimed is:

1. A polishing agent which comprises
a) water,
b) an abrasive substance and/or colloid,
(a) water in a proportion of 84 to 99.8 wt. %,
(b) silica in a proportion of 0.1 to 10 wt. %, calculated as $SiO_2$, (c) sodium or potassium salt of iminodisuccinic acid and/or of ethylenediamine disuccinic acid in a proportion of 0.01 to 1 wt. %,
(d) sodium and/or potassium carbonate in a proportion of 0.05 to 5 wt. %, and
(e) potassium or sodium gluconate in a proportion of 0.01-0.5 wt. %.

9. A process for the polishing of a semiconductor wafer which comprises polishing a wafer which has a front surface and a back surface and an edge, with the polishing agent according to claim 1.

10. The process according to claim 9, wherein the semiconductor wafer consists substantially of silicon.

11. The process according to claim 10, wherein the front surface of the silicon wafer is uncovered or is covered with native oxide and is polished with the introduction of the polishing agent.

12. The process according to claim 9, wherein at least part of the front surface of the semiconductor wafer is covered with artificially applied layers and/or structures.

13. The process according to claim 12, wherein copper is contained as an electrical conductor in the layers and/or structures.

14. The process according to claim 9, wherein the front surface and the back surface of the silicon wafer are uncovered or covered with native oxide and are polished with the introduction of the polishing agent.

15. The process according to claim 9, wherein the edge of the silicon wafer is polished with the introduction of the polishing agent.

16. The process according to claim 9, wherein at least part of the polishing agent used is recycled.

* * * * *